(12) United States Patent
Murakami

(10) Patent No.: US 6,240,840 B1
(45) Date of Patent: Jun. 5, 2001

(54) SCREEN PRINTING APPARATUS HAVING A PRESSURIZED UPPER CHAMBER

(75) Inventor: Takehiko Murakami, Inagi (JP)

(73) Assignee: Minami Co., Ltd., Inagi (JP)

( * ) Notice: Subject to any disclaimer, the term of this patent is extended or adjusted under 35 U.S.C. 154(b) by 0 days.

(21) Appl. No.: 09/453,069

(22) Filed: Dec. 2, 1999

(30) Foreign Application Priority Data

Feb. 15, 1999 (JP) .................................................. 11-035738

(51) Int. Cl.[7] ...................................................... B41F 15/08
(52) U.S. Cl. .......................... 101/114; 101/123; 101/127.1
(58) Field of Search ................................... 101/114, 115, 101/123, 124, 127.1, 129

(56) References Cited

U.S. PATENT DOCUMENTS

| | | | |
|---|---|---|---|
| 4,519,760 | * 5/1985 | Norell | 101/129 |
| 4,590,854 | * 5/1986 | Anderson | 101/115 |
| 4,702,165 | * 10/1987 | Anderson | 101/114 |
| 5,596,925 | * 1/1997 | Hasegawa | 101/127.1 |
| 5,953,989 | * 9/1999 | Uchiyama et al. | 101/127.1 |
| 6,138,562 | * 10/2000 | Hertz et al. | 101/129 |

* cited by examiner

Primary Examiner—John S. Hilten
Assistant Examiner—Leslie J. Grohusky
(74) Attorney, Agent, or Firm—Bacon & Thomas

(57) ABSTRACT

A screen printing apparatus which is structured such that a printing agent is not left within a screen hole of a mask after printing, having a main body of the screen printing apparatus whose upper side within it is formed as a chamber which can be sealed by setting a mask supporting table as a boundary, and a pressure within the chamber can be ascended and descended at a desired timing by suitable pressure ascending and descending means such as air bags and the like.

3 Claims, 2 Drawing Sheets

Prior Art

SCREEN PRINTING APPARATUS HAVING A PRESSURIZED UPPER CHAMBER

BACKGROUND OF THE INVENTION

1. Field of the Invention

The present invention relates to a screen printing apparatus, and more particularly to a screen printing apparatus which is structured such that a printing agent is not left within a screen hole of a mask after printing.

2. Description of the Prior Art

A screen printing apparatus is structured such that a mask is arranged on a plate to be printed such as a printed circuit board and the like, a printing agent such as a creamed solder and the like mounted on the mask is expanded by a squeegee, and a printing is performed at a predetermined position of the plate to be printed via a screen hole provided on the mask.

At a time of printing by the squeegee, a printing agent 103 such as a creamed solder and the like within a screen hole 102 of a mask 101 is taken out from the screen hole 102 only by an own weight of the printing agent 103 itself and an adhesive force as shown in FIG. 3 when the plate to be printed is peeled out from the mask in accordance with a downward movement of the plate to be printed such as the printed circuit board and the like, so that a power at a time of the printing agent being taken out therefrom is poor and there is a case in which the printing agent is attached to an inner surface of the screen hole 102 and left therein. Further, the printing agent gradually sticks thereto or is expanded around the screen hole at a back side thereof.

Further, there is a case in which the printing agent itself printed on a base plate lacks a sharp property. In this case, reference numeral 104 in the drawing denotes a plate to be printed such as a printed circuit board and the like.

Accordingly, it is necessary to frequently perform a cleaning of the mask while stopping the operation of a machine.

SUMMARY OF THE INVENTION

The present invention is made by taking the points mentioned above into consideration, and an object of the present invention is to provide a screen printing apparatus which is structured such that a printing agent is not left within a screen hole of a mask after printing, thereby dispensing with cleaning of the mask or extending greatly a period required for performing the mask cleaning operation.

In accordance with a gist of the present invention, there is provided a screen printing apparatus comprising the main body of a screen printing apparatus, wherein an upper side within the main body thereof is formed as a chamber which can be sealed by setting a mask supporting table as a boundary, and a pressure within the chamber can be ascended and descended at a desired timing by suitable pressure ascending and descending means.

Further, it is desirable to use an air bag placed at a suitable position within the upper side chamber as the pressure ascending and descending means for the pressure within the upper side chamber of the main body of the screen printing apparatus.

Still further, it is possible to provide a pair of the air bags within the upper side chamber, thereby inflating one of them so as to ascend the pressure and extracting a gas from another air bag after a predetermined time passed so that the pressure may return to the original state. Furthermore, it is possible to use one air bag and repeat an injection and a discharge of the gas.

DESCRIPTION OF THE PREFERRED EMBODIMENT

An embodiment in accordance with the present invention will be described below with reference to the accompanying drawings.

Figure 1:
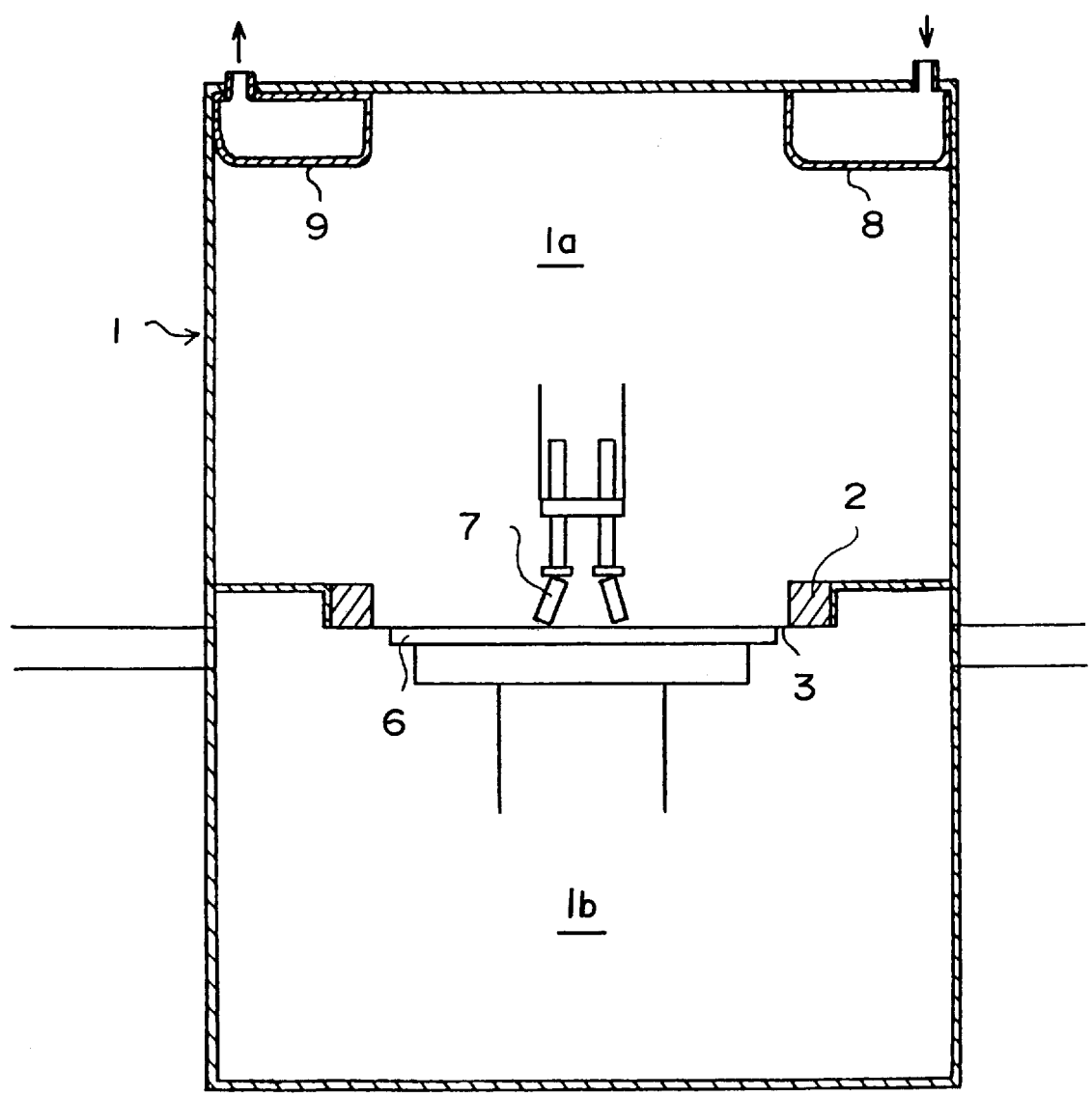
FIG. 1 is a schematic view of an embodiment in accordance with the present invention.
Figure 2:
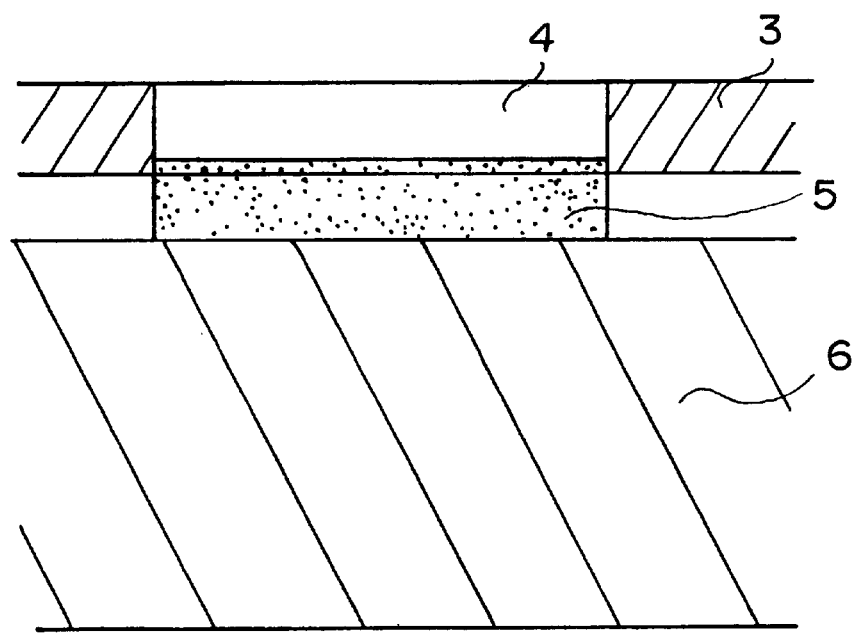
FIG. 2 is a schematic view which explains an operation in accordance with the present invention.
Figure 3:
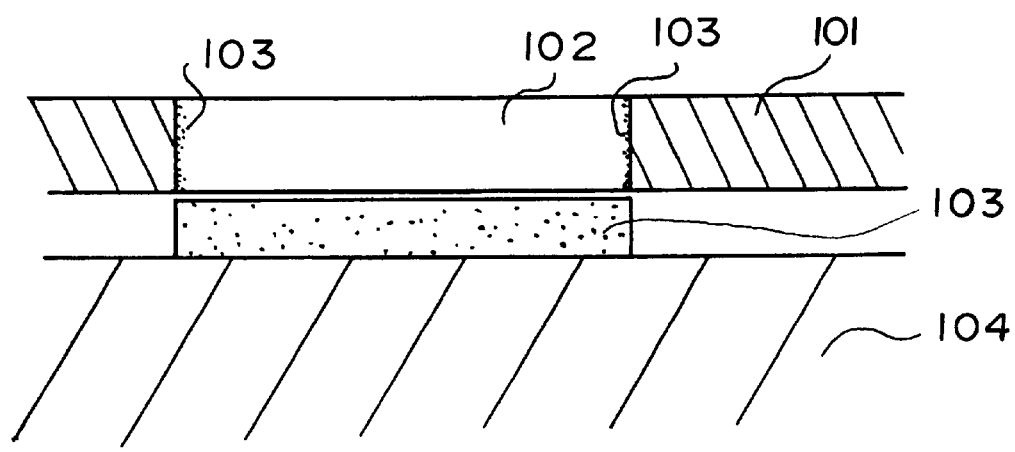
FIG. 3 is a schematic view which explains a relation between a screen hole and a printing agent in the case of printing by the conventional apparatus.

FIG. 1 is a schematic view and FIG. 2 is a schematic view explaining an operation.

In the drawings, reference numeral 1 denotes a main body of a screen printing apparatus. Further, reference numeral 2 denotes a mask supporting table. Then, a main body 1 of the screen printing apparatus forms a chamber 1a capable of being sealed by setting the mask supporting table 2 as a boundary in an upper side within a main body 1 of the screen printing apparatus. In this case, reference numeral 1b denotes a lower side chamber. Further, reference numeral 3 denotes a mask, reference numeral 4 denotes a screen hole, reference numeral 5 denotes a printing agent such as a creamed solder and the like, reference numeral 6 denotes a plate to be printed such as a printed circuit board and the like, and reference numeral 7 denotes a squeegee. Then, the plate 6 to be printed is closely attached to a back surface of the screen hole 4 in the mask 3, whereby the upper side chamber 1a becomes sealed.

Further, the structure is made such that a pressure within the upper side chamber 1a can be ascended and descended at a desired timing by an operation of air bags 8 and 9. In this case, in accordance with the present embodiment, two air bags are employed, whereby one air bag 9 is set filled with an air in advance and another air bag 8 is set empty and to be injected an air. Further, the air may be injected by known suitable means such as a pump and the like.

Then, as shown in FIG. 2, the air is injected into the air bag 8 until the printing agent 5 within the screen hole 4 of the mask 3 is taken out from the screen hole 4 at a level of about 80% thereof, thereby ascending the pressure within the upper side chamber 1a to a pressure more than the pressure (for example, 1013 hPa) of the lower side chamber 1b. In this case the increase in the pressure therein is enough to be a level of about 1126 hPa. Accordingly, the printing agent 5 is totally pressed with force, and the printing agent 5 in an outer peripheral portion is pressed out together therewith and is not left in the inner surface of the screen hole 4.

When the printing agent 5 is taken out from the screen hole 4 at about 80%, the air in the air bag 9 is taken out. Accordingly, the pressure within the upper side chamber 1a gradually descends and gradually comes closer to the pressure within the lower side chamber 1b. Therefore, the pressure is weakened in the end when the printing agent 5 is taken out from the screen hole 4, so that it is possible to prevent a sudden come-out.

Further, in accordance with the present embodiment, the air bags are used for ascending and descending the pressure within the upper side chamber 1a for the following reasons. For example, in accordance with the scope of the present invention, it is possible to increase or decrease the pressure by piercing a hole at a suitable portion of the chamber 1*a* and directly injecting the air into the chamber 1*a*, however, in this case, a temperature descends due to a slight air blow and there is a risk that the printing agent is oxidized so as to be deteriorated or the printing agent on the plate to be printed is deformed. Accordingly, the air bags are used for completely preventing the above matter.

Further, in accordance with the present embodiment, two air bags are employed, however, it is possible to repeat an injection and a discharge only by one air bag.

Since the present invention is structured in the manner mentioned above, it is possible to make the printing agent not being left within the screen hole of the mask after printing. Accordingly, it is possible to dispense with a cleaning operation of the mask or it is possible to greatly extend the period required for performing the mask cleaning operation.

What is claimed is:

1. A screen printing apparatus, comprising:
    a main body (1) having an upper chamber (1*a*) and a lower chamber (1*b*);
    a table (2) disposed in said main body (1) for supporting a mask (3) provided with a plurality of screen holes (4), said table (1) and mask (3) defining said upper and lower chambers (1*a*, 1*b*) in said main body (1);
    a carrier disposed in said lower chamber in said main body for carrying a plate (6) to be printed;
    a squeegee (7) arranged above said plate (6) in said upper chamber (1*a*) in said main body (1) for applying a printing agent (5) to said plate (6) through said mask (3);
    a first air bag (8) disposed in said upper chamber (1*a*) for increasing a pressure in said upper chamber (1*a*); and
    a second air bag (9) disposed in said upper chamber (1*a*) for decreasing a pressure in said upper chamber (1*a*).

2. A screen printing apparatus according to claim 1, wherein said first air bag (8) is inflated by injecting air into said air bag.

3. A screen printing apparatus according to claim 1, wherein said second air bag (9) is contracted by discharging air from said air bag.

* * * * *